United States Patent
Yu et al.

(10) Patent No.: US 8,740,321 B2
(45) Date of Patent: *Jun. 3, 2014

(54) SLIDE RAIL

(75) Inventors: Mo-Ming Yu, Shenzhen (CN); Ze-Hong Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 175 days.

This patent is subject to a terminal disclaimer.

(21) Appl. No.: 13/175,957

(22) Filed: Jul. 5, 2011

(65) Prior Publication Data

US 2012/0170878 A1    Jul. 5, 2012

(30) Foreign Application Priority Data

Dec. 30, 2010 (CN) .......................... 2010 1 0614746

(51) Int. Cl.
*A47B 88/00* (2006.01)

(52) U.S. Cl.
USPC ................................ 312/334.8; 312/334.11

(58) Field of Classification Search
USPC ........ 312/334.4, 334.5, 334.6, 334.8, 334.14, 312/350, 334.1, 334.11; 384/18, 20, 22
See application file for complete search history.

(56) References Cited

U.S. PATENT DOCUMENTS

| | | | | |
|---|---|---|---|---|
| 3,588,198 A | * | 6/1971 | Stewart et al. | 384/18 |
| 3,650,578 A | * | 3/1972 | Del Vecchio et al. | 384/18 |
| 4,194,793 A | * | 3/1980 | Offermans | 384/18 |
| 4,469,384 A | * | 9/1984 | Fler et al. | 312/333 |
| 5,775,786 A | * | 7/1998 | Liebertz | 312/334.8 |
| 6,244,678 B1 | * | 6/2001 | Dopp et al. | 312/333 |
| 6,280,086 B1 | * | 8/2001 | Stijns | 384/18 |
| 6,854,816 B2 | * | 2/2005 | Milligan | 312/334.11 |
| 6,984,008 B2 | * | 1/2006 | Milligan | 312/333 |
| 8,235,479 B2 | * | 8/2012 | Yu et al. | 312/334.16 |
| 8,251,465 B2 | * | 8/2012 | Yu et al. | 312/334.7 |
| 2004/0155563 A1 | * | 8/2004 | Young et al. | 312/334.8 |

* cited by examiner

*Primary Examiner* — Darnell Jayne
*Assistant Examiner* — Andres F Gallego
(74) *Attorney, Agent, or Firm* — Novak Druce Connolly Bove + Quigg LLP

(57) ABSTRACT

A slide rail includes an outer rail, an intermediate rail, an inner rail, and a plurality of ball brackets with balls. The ball brackets are received between the outer rail and the intermediate rail. The intermediate rail is received between the outer rail and the inner rail. The intermediate rail is slidable relative to the outer rail through the balls. The inner rail slidably contacts the intermediate rail.

7 Claims, 3 Drawing Sheets

SLIDE RAIL

CROSS-REFERENCE OF RELATED APPLICATION

Relevant subject matter is disclosed in a pending U.S. patent application, titled "SLIDE RAIL FOR RACK SERVER", with the application Ser. No. 12/954,660, filed on Nov. 25, 2010, which is assigned to the same assignee as this patent application.

BACKGROUND

1. Technical Field

The present disclosure relates to a slide rail.

2. Description of Related Art

Slide rails are widely used in many devices, such as server cabinets. The slide rails ordinarily include an outer rail, an intermediate rail, and an inner rail. Slide mechanisms positioned between the outer rail and intermediate rail, and between the intermediate rail and inner rail, include a ball-type structure and a friction-type structure. The ball-type structure can slide smoothly, but is costly. The friction-type structure has lower cost and better bearing capacity, but cannot slide as smoothly as the ball-type one.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
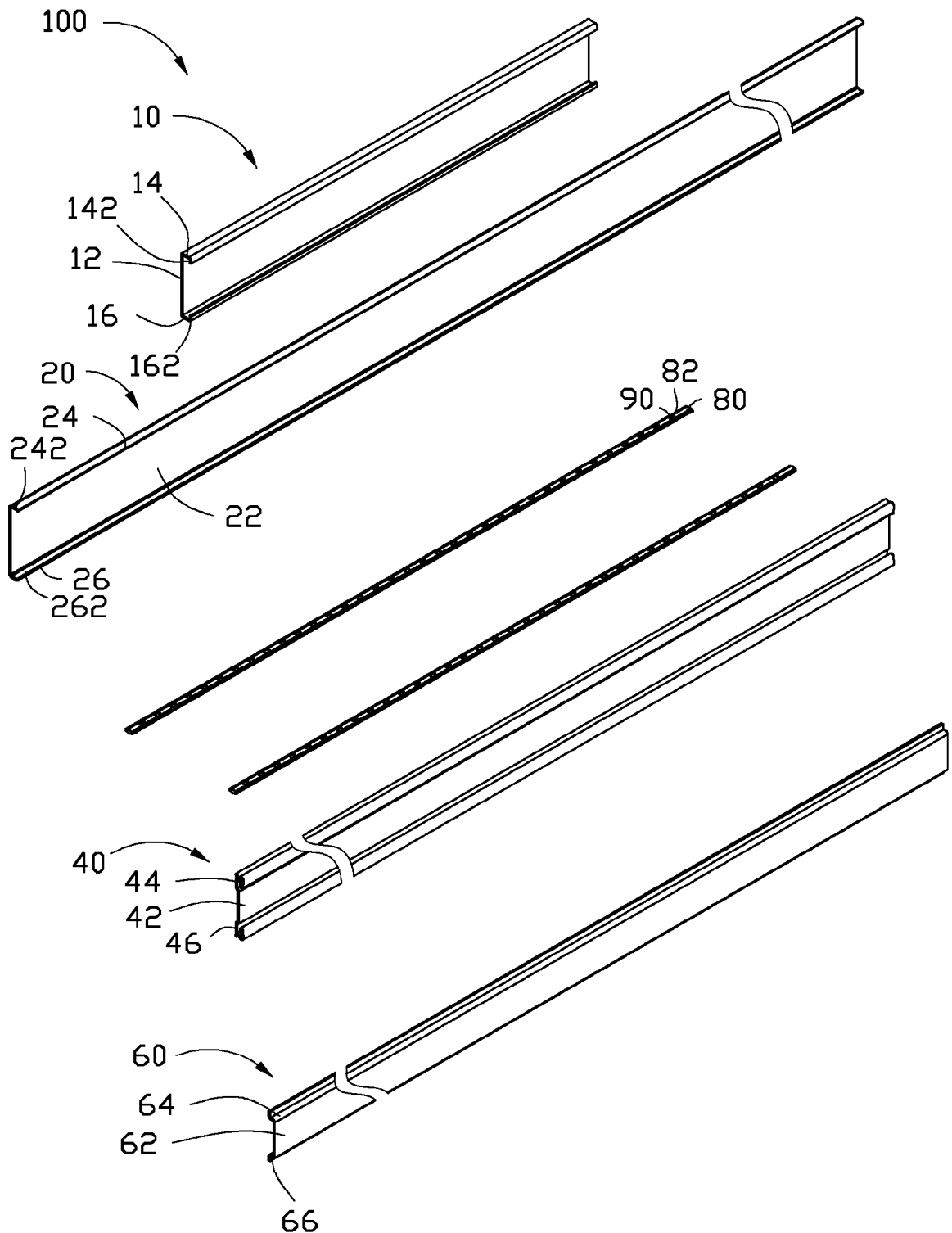
FIG. 1 is an exploded, isometric view of an exemplary embodiment of a slide rail.
Figure 2:
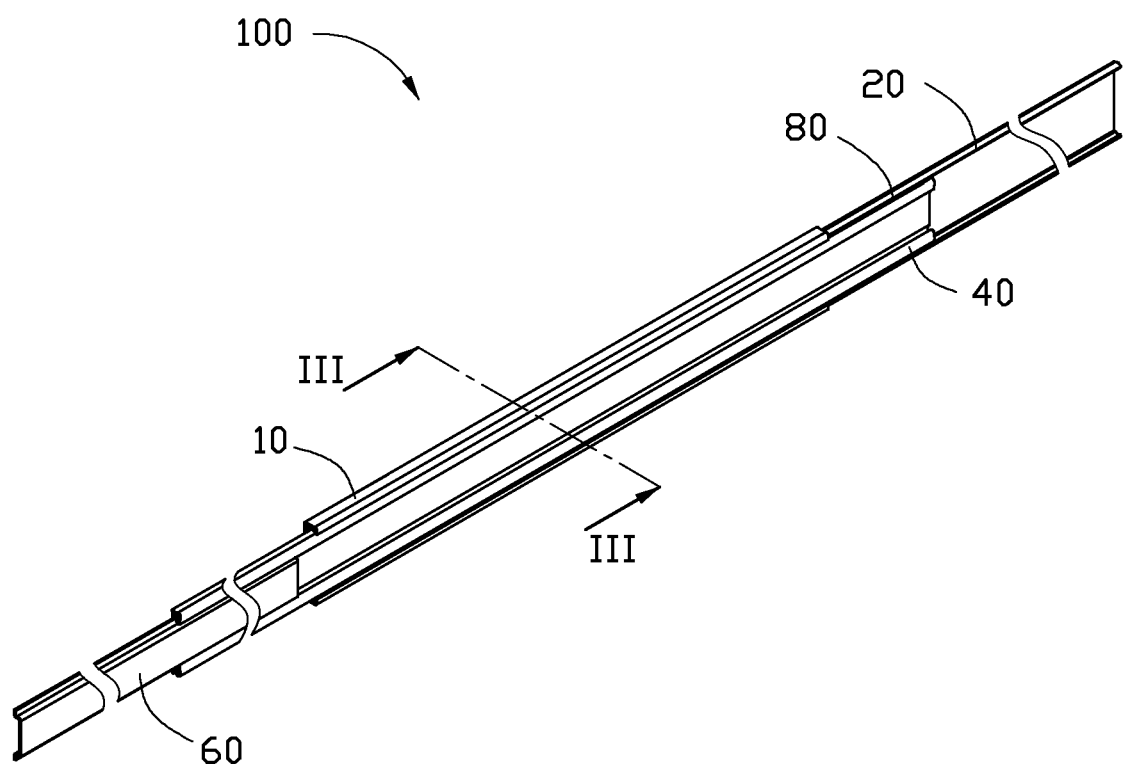
FIG. 2 is an assembled, isometric view of FIG. 1.

Referring to FIGS. 1 and 2, an exemplary embodiment of a slide rail 100 includes a fixing frame 10, an outer rail 20, an intermediate rail 40, an inner rail 60, and two ball brackets 80 mounted with steel balls 90. The fixing frame 10 is used to be fixed to a shelf (not shown), such as a server cabinet or a cupboard. The inner rail 60 is fixed to a sidewall of a server or a drawer slidably mounted to the server cabinet or the cupboard. The intermediate rail 40 is slidably mounted between the outer rail 20 and the inner rail 60. The ball brackets 80 are positioned between the outer rail 20 and the intermediate rail 40. The intermediate rail 40 can slide relative to the outer rail 20 through the balls 90.

The fixing frame 10 is substantially U-shaped in cross section, and includes a fixing plate 12 to be mounted to the shelf or the cupboard, and two sidewalls 14 and 16 extending from two sides of the fixing plate 12. Flanges 142 and 162 extend toward each other respectively from sides of the two sidewalls 14 and 16 opposite to the fixing plate 12. The sidewalls 14 and 16, and the fixing plate 12 cooperatively bind a receiving space for receiving the outer rail 20 therein.

Figure 3:
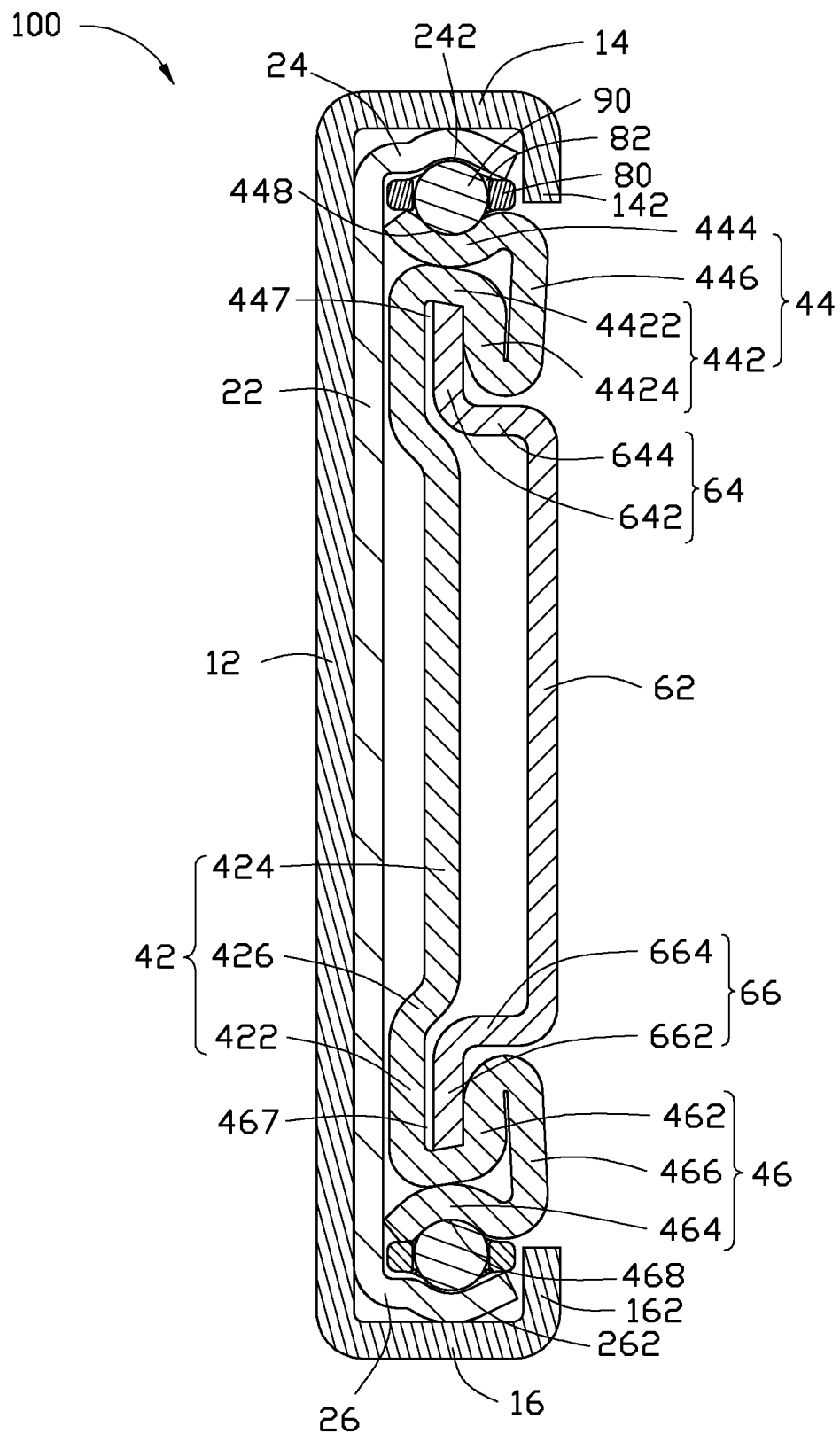
FIG. 3 is a sectional view of FIG. 2, taken along the line of III-III.

Referring to FIG. 3, the outer rail 20 is substantially U-shaped, and includes a first main plate 22, a first top side part 24, and a first bottom side part 26. The two first side parts 24 and 26 are symmetrically positioned on two opposite sides of the first main plate 22, integrally extending from the first main plate 22 respectively. The first side parts 24 and 26 are substantially V-shaped in cross section. At each inner side of the first side parts 24 and 26, first recesses 242 and 262 are formed respectively.

The intermediate rail 40 includes a second main plate 42, a second top side part 44, and a second bottom side part 46. The second side parts 44 and 46 are symmetrically positioned on two opposite sides of the second main plate 42, integrally extending from the second main plate 42 respectively.

The second main plate 42 includes a pair of end portions 422, a flat panel 424, and a pair of connection portions 426. The end portions 422 are positioned on two sides of the flat panel 424 and parallel to the flat panel 424 respectively. The connection portions 426 are connected between the pair of end portions 422 and the two sides of the flat panel 424, respectively. The connection portions 426 are symmetrically inclined to the flat panel 424.

The two second side parts 44 and 46 symmetrically have the same structure, so the second top side part 44 is mainly described below for simplicity. The second top side part 44 includes a first bent portion 442, a second bent portion 444, and a connecting plate 446 connected between the first bent portion 442 and the second bent portion 444. The first bent portion 442 includes an extension plate 4422 and a linking plate 4424. The extension plate 4422 is substantially perpendicularly extended from a side of the end portion 422 of the second main plate 42 opposite to the connection portion 426. The linking plate 4424 is substantially perpendicularly extended from a side of the extension plate 4422 opposite to the end portion 422, toward the other second side part 46. The end portion 422, the extension plate 4422, and the linking plate 4424 cooperatively bind a second recess 447. The connecting plate 446 is extended from a side of the linking plate 4424 opposite to the extension plate 4422, overlapping with the linking plate 4424. A sectional length of the linking plate 4424 is less than a sectional length of the end portion 422. The second bent portion 444 is extended from a side of the connecting plate 446 opposite to the linking plate 4424, and is curved toward and resists against the extension plate 4422 to form a third recess 448 opposite to the extension plate 4422. The third recess 448 can receive portions of the balls exposed from a first side of the corresponding ball bracket 80. The third recess 448 faces the first recess 242 of the outer rail 20.

Similarly, the second bottom side part 46 includes a first bent portion 462, a second bent portion 464, and a connecting plate 466 connected between the first bent portion 462 and the second bent portion 464. The end portion 422 and the first bent portion 462 cooperatively bind a second recess 467. A third recess 468 is formed in the second bent portion 464 opposite to the first bent portion 462.

The inner rail 60 is substantially U-shaped, and includes a third main plate 62, a third top side part 64, and a third bottom side part 66. The third top side part 64 and the third bottom side part 66 are symmetrically positioned on two opposite sides of the third main plate 62, integrally extending from the third main plate 62 respectively.

The third top side part 64 includes a sliding portion 642 and a connecting portion 644 connected between the sliding portion 642 and the third main plate 62. The sliding portion 642 is substantially parallel to the third main plate 62, and slidably received in the second recess 447 of the second top side part 44 of the intermediate rail 40.

Similarly, the third bottom side part 66 includes a sliding portion 662 and a connecting portion 664 connected between the sliding portion 662 and the third main plate 62. The sliding portion 662 is substantially parallel with the third main plate 62, and slidably received in the second recess 467 of the second bottom side part 46 of the intermediate rail 40.

In assembly of the inner rail 60 to the intermediate rail 40, the sliding portions 642 of the inner rail 60 are slidably received in the second recesses 447 and 467 of the intermediate rail 40, respectively.

In assembly of the intermediate rail 40 to the outer rail 20, the ball brackets 80 are received in the first recesses 242 and 262 of the outer rail 20, with portions of the balls 90 of each ball bracket 80 at a side of the ball bracket 80 slidable in the corresponding first recess 242 or 262. The intermediate rail 40 is accommodated between the first side parts 24 and 26, with portions of the balls 90 of each ball bracket at an opposite side of the ball bracket 80 slidable in the corresponding second recess 448 or 468.

In assembly of the outer rail 20 to the fixing frame 10, the outer rail 20 is received between the sidewalls 14 and 16 of the fixing frame 10. The sidewalls 14 and 16 respectively abut against the first side parts 24 and 26 of the outer rail 20. The flanges 142 and 162 enhance structural strength of the fixing frame 10.

While the disclosure has been described by way of example and in terms of the embodiments, it is to be understood that the disclosure is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A slide rail comprising:
   an outer rail comprising a first main plate and two first sidewalls extending from opposite sides of the first main plate, an inner surface of each first sidewall longitudinally defines a first recess;
   an intermediate rail slidably received in the outer rail, the intermediate rail comprising a second main plate and two second sidewalls extending from opposite sides of the second main plate, each second sidewall comprising a first bent portion extending from a corresponding one of the opposite sides of the second main plate, a second bent portion located outside the first bent portion, and a connecting plate connecting between the first bent portion and the second bent portion, each first bent portion, together with the corresponding one of the opposite sides of the second main plate, binding a second recess open toward another corresponding one of the opposite sides of the second main plate, the second bent portion located between a corresponding one of the first sidewalls of the outer rail and the first bent portion, and defining a third recess facing the first recess;
   an inner rail received in the intermediate rail, the inner rail comprising a third main plate and two third sidewalls extending from opposite sides of the third main plate, each third sidewall comprising a sliding portion slidably received in a corresponding one of the second recesses of the intermediate rail; and
   a ball bracket with a plurality of balls positioned between the outer rail and the intermediate rail, and located in the first and third recesses;
   wherein the second main plate comprises a flat panel, two end portions at opposite sides of the flat panel, and two connection portions each slantingly connected between a corresponding side of the flat panel and a corresponding end portion; and
   wherein the first bent portion comprises an extension plate perpendicularly extending from a side of a corresponding end portion opposite to the connection portion, and a linking plate substantially perpendicularly extending from a side of the extension plate opposite to the corresponding end portion, wherein the end portion, the extension plate, and the linking plate cooperatively bind the second recess.

2. The slide rail of claim 1, wherein the first sidewalls are substantially V-shaped in cross section, with the first recesses defined respectively therein.

3. The slide rail of claim 1, wherein each connecting plate is substantially parallel to the flat panel.

4. The slide rail of claim 1, wherein the second bent portion is curved toward and resists against the extension plate to form the third recess opposite to the extension plate.

5. The slide rail of claim 1, wherein each third sidewall further comprises a connecting portion substantially perpendicularly extending from a corresponding side of the third main plate, the sliding portion substantially perpendicularly extends from a side of the connecting portion opposite to the third main plate and is parallel to the third main plate.

6. A slide rail comprising:
   an outer rail comprising a first main plate and two first sidewalls extending from opposite sides of the first main plate, an inner surface of each first sidewall longitudinally defines a first recess;
   an intermediate rail slidably received in the outer rail, the intermediate rail comprising a second main plate and two second sidewalls extending from opposite sides of the second main plate, each second sidewall comprising a first bent portion extending from a corresponding one of the opposite sides of the second main plate, a second bent portion located outside the first bent portion, and a connecting plate connecting between the first bent portion and the second bent portion, each first bent portion, together with the corresponding one of the opposite sides of the second main plate, binding a second recess open toward another corresponding one of the opposite sides of the second main plate, the second bent portion located between a corresponding one of the first sidewalls of the outer rail and the first bent portion, and defining a third recess facing the first recess;
   an inner rail received in the intermediate rail, the inner rail comprising a third main plate and two third sidewalls extending from opposite sides of the third main plate, each third sidewall comprising a sliding portion slidably received in a corresponding one of the second recesses of the intermediate rail;
   a ball bracket with a plurality of balls positioned between the outer rail and the intermediate rail, and located in the first and third recesses; and
   a fixing frame defining a receiving space for receiving the outer rail;
   wherein the second main plate comprises a flat panel, two end portions at opposite sides of the flat panel, and two connection portions each slantingly connected between a corresponding side of the flat panel and a corresponding end portion; and
   wherein the first bent portion comprises an extension plate perpendicularly extending from a side of a corresponding end portion opposite to the connection portion, and a linking plate substantially perpendicularly extending from a side of the extension plate opposite to the corresponding end portion, wherein the end portion, the extension plate, and the linking plate cooperatively bind the second recess.

7. The slide rail of claim 6, wherein the fixing frame is substantially U-shaped in cross section, and comprises a fixing plate, two sidewalls extending from two sides of the fixing plate, and two flanges extending toward each other from sides of the two sidewalls opposite to the fixing plate, the sidewalls, the fixing plates, and the flanges cooperatively bind the receiving space.

* * * * *